United States Patent [19]

Yajima

[11] Patent Number: 5,162,759

[45] Date of Patent: Nov. 10, 1992

[54] PIEZOELECTRIC FILTER STAGE SELECTABLY CONNECTABLE IN SERIES WITH ANOTHER PIEZOELECTRIC FILTER STAGE

[75] Inventor: Kotaro Yajima, Tokyo, Japan

[73] Assignee: Kinseki Limited, Tokyo, Japan

[21] Appl. No.: 677,789

[22] Filed: Mar. 29, 1991

[30] Foreign Application Priority Data

Mar. 30, 1990 [JP] Japan ................................. 2-84590

[51] Int. Cl.$^5$ ............................................. H03H 9/46
[52] U.S. Cl. ..................................... 333/188; 333/189
[58] Field of Search ............... 333/188, 174, 173, 168, 333/167, 189, 192

[56] References Cited

U.S. PATENT DOCUMENTS

| 3,469,213 | 9/1969 | Baker ................................ 333/173 |
| 3,526,858 | 9/1970 | Heinlein et al. ................. 333/173 |
| 3,566,312 | 2/1971 | McDonald ........................ 333/174 |
| 3,886,316 | 5/1975 | Getgen ........................... 333/173 X |
| 4,378,538 | 3/1983 | Gignoux ........................... 333/173 |
| 5,019,794 | 5/1991 | Letessier et al. ................. 333/174 |

FOREIGN PATENT DOCUMENTS

| 673688 | 3/1939 | Fed. Rep. of Germany ...... 333/167 |
| 1058108 | 3/1954 | France .............................. 333/167 |
| 55-171121 | 12/1980 | Japan . |

Primary Examiner—Eugene R. LaRoche
Assistant Examiner—Benny Lee
Attorney, Agent, or Firm—Blakely, Sokoloff, Taylor & Zafman

[57] ABSTRACT

A band-pass filter includes a first filter, a second filter, and switching elements. The first filter is constituted by a plurality of filter elements. The second filter is constituted by a plurality of filter means and connected in series with the first filter. The switching elements can short-circuit either one of the first and second filters.

3 Claims, 3 Drawing Sheets

PIEZOELECTRIC FILTER STAGE SELECTABLY CONNECTABLE IN SERIES WITH ANOTHER PIEZOELECTRIC FILTER STAGE

BACKGROUND OF THE INVENTION

The present invention relates to a band-pass filter which can switch pass bands.

As a conventional band-pass filter of this type, a quartz filter or a piezoelectric ceramic filter has been used. In this band-pass filter, when pass bands are to be switched, a filter having a desired bandwidth is selected from a plurality of parallel-connected filters having different bandwidths by using a switching means such as a relay.

FIG. 3 shows an example of the band-pass filter described above. First and second filters 1 and 2 having different bandwidths are connected in parallel. In this arrangement, pass bands are switched from each other by selecting one of the filters 1 and 2 by using switches 3-1 and 3-2 synchronously operated in the same direction. In this case, the first filter 1 is constituted by six (n=6) quartz filter elements 1-1 to 1-6 which are connected as shown in FIG. 4. The second filter 2 is constituted by four (n=4) quartz filter elements similar in electrical connection to those shown in FIG. 4.

Such a band-pass filter, e.g., the band-pass filter shown in FIG. 3, requires an area and a volume corresponding to ten quartz filter elements because it is constituted by the first and second filters 1 and 2.

Recent mobile radio units (e.g., compact mobile radio units and portable telephone units), however, require smaller, lighter circuit arrangements. The use of the above-described band-pass filter, therefore, cannot satisfy such a requirement.

SUMMARY OF THE INVENTION

It is an object of the present invention to provide a band-pass filter which can realize the same performance as that of a conventional band-pass filter by using a small number of filter elements, thereby allowing a reduction in size and weight of a mobile radio unit or the like.

In order to achieve the above object, according to the present invention, there is provided a band-pass filter comprising first filter means constituted by a plurality of filter elements, second filter means constituted by a plurality of filter means and connected in series with the first filter means, and switching means for short-circuiting either one of the first and second filter means.

According to the present invention, therefore, if, for example, the number of filter elements of the first filter means is set to be n=4; and that of the second filter means, n=2, a band-pass filter having n =6 can be obtained with the first and second filter means being connected in series. In contrast to this, if the second filter means is short-circuited, a band-pass filter having n=4 can be obtained.

DESCRIPTION OF THE PREFERRED EMBODIMENTS

A band-pass filter according to the present invention will be described in detail below.

Figure 1:
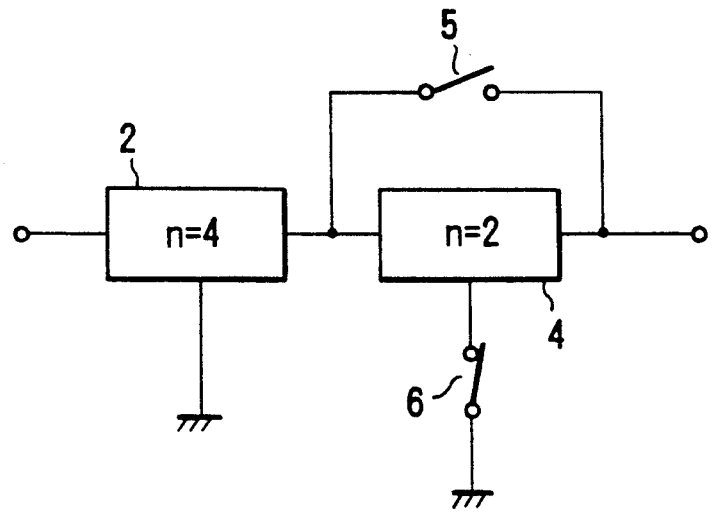
FIG. 1 is a block diagram showing a band-pass filter according to an embodiment of the present invention.
Figure 4:
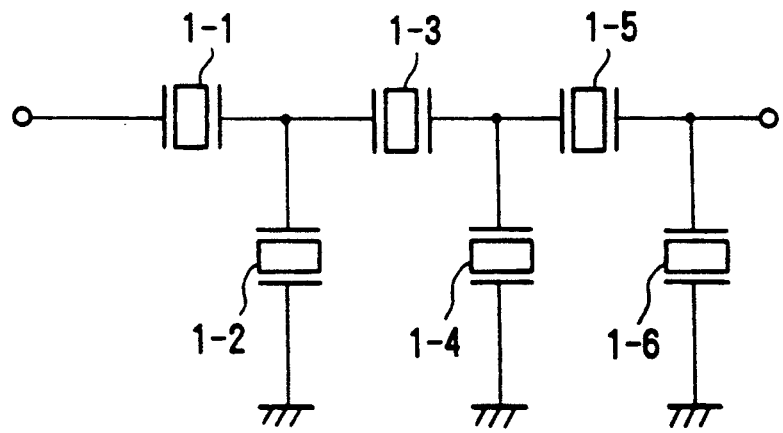
FIG. 4 is a view showing a connecting state of quartz filter elements constituting a first filter in the band-pass filter in FIG. 3.

FIG. 1 shows an embodiment of this band-pass filter. In the band-pass filter, a filter 2 having n =4 and a filter 4 having n=2 are connected in series. A first switch 5 is connected between the input and output terminals of the filter 4. A second switch 6 is connected to the ground line of the filter 4. Note that the filter 4 is constituted by two quartz filter elements similar in electrical connection to those of the filter 2. The filters 2 and 4 have the same center frequency. Furthermore, in the filter 4, the minimum filter elements constituting the filter 4 (corresponding to the quartz filter elements 1-1 and 1-2 in FIG. 4) are designed to have the same center frequency.

In the band-pass filter having such an arrangement, the switches 5 and 6 are synchronously operated in opposite directions. FIG. 1 shows a state wherein the first switching mode is set. More specifically, in the first switching mode, the switch 5 is open, and the switch 6 is closed. In this state, the filters 2 and 4 are connected in series and hence are operated as a band-pass filter having a narrow pass band corresponding to n=6. In contrast to this, in the second switching mode, in which the switch 5 is closed, and the switch 6 is open, the filter 4 is short-circuited and hence the overall circuit is operated as a band-pass filter having a wide pass band corresponding to n=4.

Figure 3:
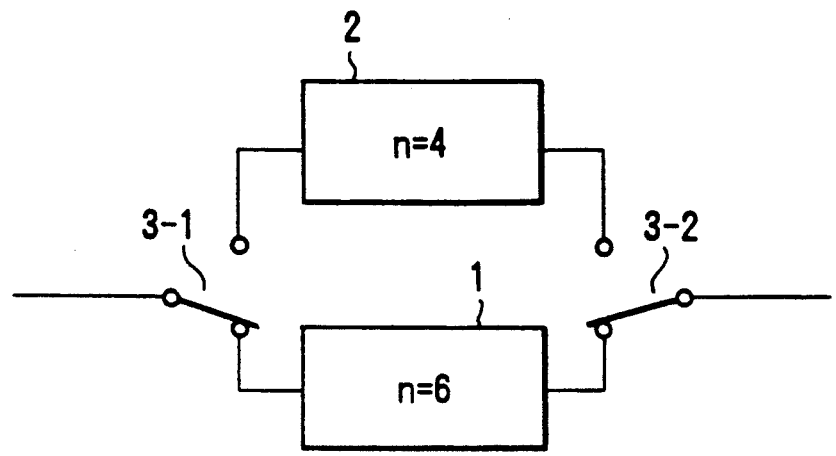
FIG. 3 is a block diagram showing a conventional band-pass filter.

As described above, the band-pass filter of this embodiment requires an area and a volume corresponding to only six quartz filter elements to obtain the same performance as that of the conventional band-pass filter shown in FIG. 3. Therefore, the use of this band-pass filter for a mobile radio unit or the like leads to a reduction in size and weight of the unit.

In the above-described embodiment, in the second switching mode, the filter 4 is short-circuited. However, the filter 2 may be short-circuited instead. If the filter 2 is short-circuited, the overall circuit is operated as a band-pass filter having a wide pass band corresponding to n=2.

Figure 2:
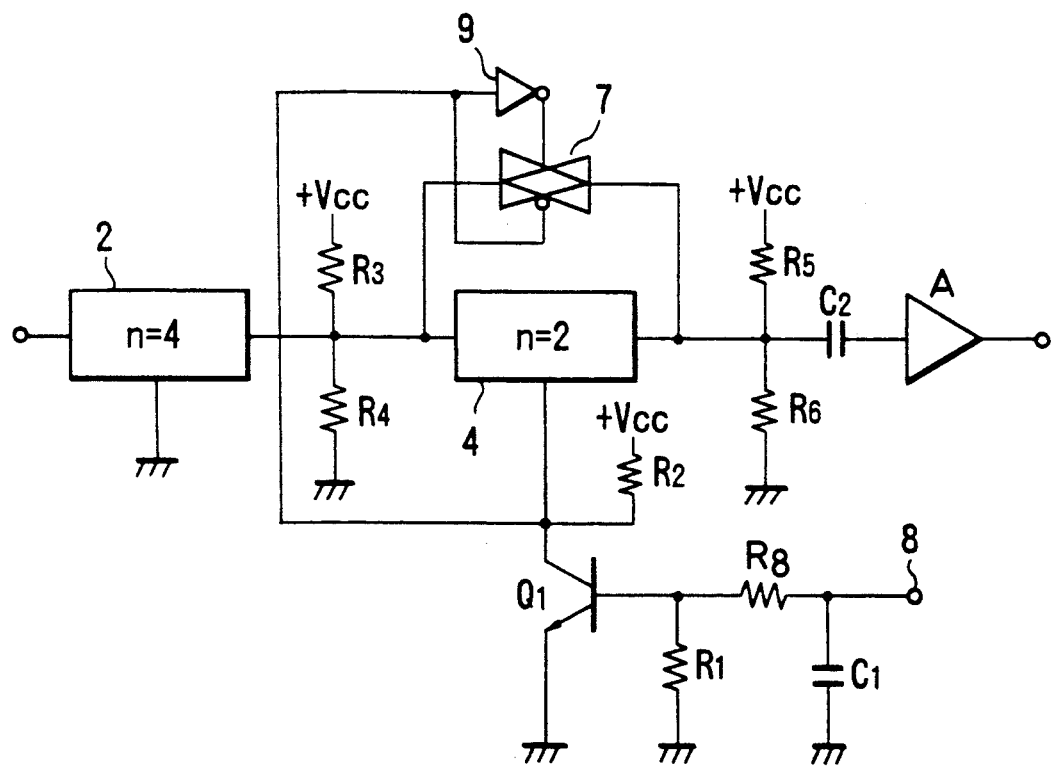
FIG. 2 is a block diagram showing a band-pass filter according to another embodiment of the present invention.

FIG. 2 shows another embodiment in which the switches 5 and 6 in the band-pass filter in FIG. 1 are respectively replaced with an analog switch 7 and a transistor $Q_1$.

Resistors R1 and R8 and capacitor C1 are coupled between control terminal 8 and the base of transistor Q1. Resistor R2 is coupled between voltage source +Vcc and the collector of transistor Q1 to provide biasing, as can be seen in FIG. 2. Resistor R3, coupled to +Vcc, and R4 are coupled to the input of filter 4 to provide biasing. Resistors R5, coupled to +Vcc, R6 and capacitor C2 are coupled to the output of filter 4 to provide biasing. Amplifier A is coupled to the output of filter 4 for amplifying its output, as is evident from FIG. 2. In the band-pass filter shown in FIG. 2, when an HIGH-level signal is supplied to a control terminal 8, the transistor $Q_1$ is turned on, and the HIGH-level signal is then supplied to the analog switch 7 through an inverter 9. Upon reception of the HIGH-level signal, the analog switch 7 is turned off. That is, if the HIGH-level signal is supplied to the control terminal 8, the analog switch 7 is turned off, and the transistor $Q_1$ is turned on. As a result, the first switching mode is set, and the filters 2 and 4 are connected in series with each other to be operated as a band-pass filter having a narrow pass band corresponding to n=6. In contrast to this, if an Low-level signal is supplied to the control terminal 8, the transistor $Q_1$ is turned off, and the Low-level signal is supplied to the analog switch 7 through the inverter 9. Upon reception of the Low-level signal, the analog switch 7 is turned on. That is, if the Low-level signal is supplied to the control terminal 8, the analog switch 7 is turned on, and the transistor $Q_1$ is turned off. As a result, the second switching mode is set to short-circuit the filter 4, and the overall circuit is operated as a band-pass filter having a wide pass band corresponding to n=4.

Figure 5:
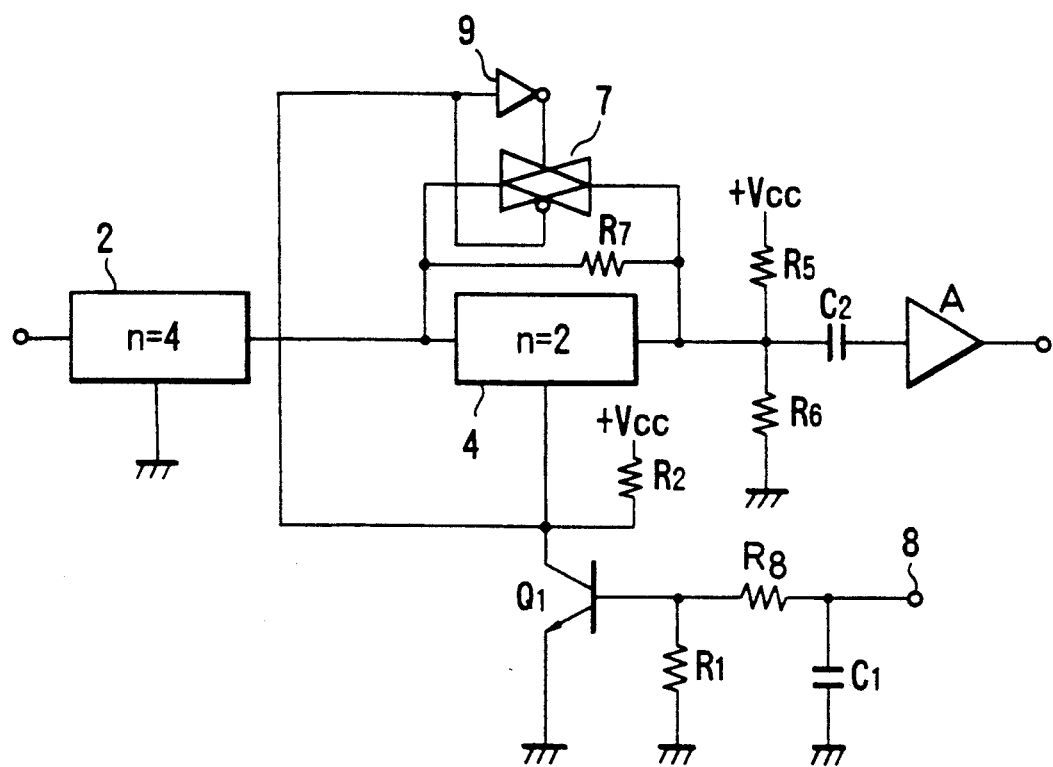

FIG. 5 shows another embodiment of the present invention. The circuit of this embodiment is the same as that shown in FIG. 2 except that the resistors R3 and R4 are omitted, and a resistor R7 is connected in parallel with the filter 4. With this arrangement, the potential between the resistors R5 and R6 can be applied as a bias to the input terminal of the filter 4 through the resistor R7. In this arrangement, the number of resistors can be reduced by one.

In addition, another circuit may be designed such that the resistors R5 and R6 in FIG. 2 are omitted, and a resistor R7 is connected in parallel with the filter 4 in the same manner as described above. With this arrangement, the bias at the output terminal of the filter 4 can be ensured by the resistors R3 and R4.

As has been described above, according the band-pass filter of the present invention, a first filter means constituted by a plurality of filter elements is connected in series with a second filter means constituted by a plurality of filter elements in such a manner that either one of the first and second filter means can be short-circuited. With this arrangement, the same performance as that of the conventional band-pass filter can be obtained with a small number of filter elements, thus realizing a reduction in size and weight of a mobile radio unit or the like.

What is claimed is:

1. A band-pass filter comprising:
   first filter means constituted by a plurality of piezoelectric filter elements, having a first center frequency, said first filter means having a first input and first output;
   second filter means constituted by a plurality of piezoelectric filter elements having a second center frequency, said second filter means having a second input and second output and said second input being connected in series with said first output of said first filter means; and
   switching means operatively coupled to said band-pass filter for short-circuiting and ungrounding a predetermined one of said first and second filter means in one mode, and providing ground connection to said predetermined one of said first and second filter means in another mode.

2. A filter according to claim 1, wherein said first filter means and said second filter means have the same center frequency.

3. A filter according to claim 1, wherein said switching means includes a pair of switching elements simultaneously operated in opposite open-closed states such that in a first mode when a first switching element of the pair is open, a second switching element of the pair is closed, and in a second mode when said first switching element is closed, the second switching element is open, said first mode allowing said second filter means to be short circuited by said second switching element while the ground connection is open by said first switching element, and said second mode allowing said first filter means to be connected in series with said second filter means by providing the ground connection through said first switching element to said second filter means.

* * * * *